United States Patent
Nayebi et al.

[19]

[11] Patent Number: 6,072,341
[45] Date of Patent: Jun. 6, 2000

[54] DRIVER CIRCUIT WITH PULL DOWN NPN TRANSISTOR AND GAIN REDUCTION

[75] Inventors: Merhdad Nayebi, Palo Alto; Duc Ngo, San Jose, both of Calif.

[73] Assignees: Sony Corporation, Tokyo, Japan; Sony Electronics, Inc., Park Ridge, N.J.

[21] Appl. No.: 08/853,497

[22] Filed: May 8, 1997

[51] Int. Cl.$^7$ .................................................. H03F 3/26
[52] U.S. Cl. ........................ 327/112; 327/478; 327/384; 326/89; 330/262
[58] Field of Search ................................. 330/262, 270, 330/272, 273; 326/26, 27, 89; 327/108, 112, 384, 387, 478

[56] References Cited

U.S. PATENT DOCUMENTS

| | | | |
|---|---|---|---|
| 4,300,103 | 11/1981 | Van De Plassche | 330/272 |
| 4,573,021 | 2/1986 | Widlar | 330/273 |
| 4,803,442 | 2/1989 | Hogg | 330/274 |
| 5,216,296 | 6/1993 | Tsunoi et al. | 326/89 |
| 5,343,092 | 8/1994 | Dhong et al. | 326/126 |
| 5,420,532 | 5/1995 | Teggatz et al. | 327/387 |
| 5,610,538 | 3/1997 | Kim | 326/87 |
| 5,654,648 | 8/1997 | Medhekar et al. | 326/27 |

FOREIGN PATENT DOCUMENTS

| | | | |
|---|---|---|---|
| 0045691 | 2/1982 | European Pat. Off. | H03F 3/50 |
| 0586251 | 3/1994 | European Pat. Off. | H03F 1/32 |
| 3501886 | 7/1986 | Germany | H03F 3/50 |
| 60-121805 | 6/1985 | Japan | 330/270 |

Primary Examiner—Timothy P. Callahan
Assistant Examiner—Terry L. Englund
Attorney, Agent, or Firm—Haverstock & Owens LLP

[57] ABSTRACT

A driver circuit with pull down npn transistor drives an output voltage signal in response to an input voltage signal, without high-speed pnp transistors. A first npn transistor provides current to the output node when the output node is at a level equal to and less than the level of the input voltage signal less a base-to-emitter junction drop across the first npn transistor. A second npn transistor sinks current from the output node when the output node is at a level greater than the level of the input voltage signal less the base-to-emitter junction drop across the first npn transistor. The second npn transistor is controlled by a level of a control node. When the level of the output node is greater than the level of the input voltage signal less the base-to-emitter junction drop, the first npn transistor is turned off and the level of the control node is charged up by a current source. When the level of the control node reaches a sufficient level, the second npn transistor is turned on and the level of the output voltage signal is decreased.

29 Claims, 4 Drawing Sheets

DRIVER CIRCUIT WITH PULL DOWN NPN TRANSISTOR AND GAIN REDUCTION

FIELD OF THE INVENTION

The present invention relates to the field of driver circuits. More particularly, the present invention relates to the field of driver circuits for driving a video signal for a monitor.

BACKGROUND OF THE INVENTION

In order to drive state-of-the-art high performance monitors it is necessary to use a high power and high bandwidth driver circuit capable of operating at speeds in excess of 33 MHz, while driving 1.4 Volt signals onto a 75 ohm line. Conventional driver circuits use a push-pull output stage, as illustrated in FIG. 1, with high speed npn and pnp transistors, in order to prevent large amounts of wasted power in the output stage. Within the driver circuit of FIG. 1, a collector of an npn transistor 10 is coupled to a positive supply voltage +VCC. A collector of a pnp transistor 12 is coupled to a negative supply voltage −VCC. A base of the transistor 10 is coupled to a base of the transistor 12, thereby forming an input node to which an input voltage signal Vin is coupled. An emitter of the transistor 10 is coupled to an emitter of the transistor 12 and to a first terminal of a load resistor RL, thereby forming an output node from which an output voltage signal Vout is provided. A second terminal of the resistor RL is coupled to ground.

In this driver circuit, the transistors 10 and 12 are coupled together in such a way that they cannot simultaneously conduct. When the input voltage Vin is at a level of zero volts, both of the transistors 10 and 12 are cut off and the output voltage Vout is also at a level of zero volts. As the input voltage Vin goes positive and exceeds a level of 0.5 volts, the transistor 10 begins to conduct and operates as an emitter follower. In this case, the output voltage Vout will follow the input voltage Vin and will be equal to the value of the input voltage Vin less the voltage drop across the base-to-emitter junction of the transistor 10, as illustrated by the following equation:

$$\text{Vout}=\text{Vin}-V_{BE10} \text{ When Vin}>0.5 \text{ Volts} \quad (1)$$

Also, in this situation, when the input voltage is greater than 0.5 volts, the transistor 10 will supply the load current IL through the load resistor RL. Because the level of the output voltage Vout is less than the level of the input voltage Vin, the emitter-base junction of the transistor 12 is reverse-biased and will be cut off. As the input voltage Vin remains positive the output voltage Vout will follow the input voltage Vin and remain at a level equal to the input voltage Vin less the voltage across the base-to-emitter junction of the transistor 10.

When the input voltage Vin goes negative and is less than −0.5 volts, the transistor 12 begins to conduct and operates as an emitter follower. Again, the output voltage Vout will follow the input voltage Vin and will be equal to the value of the input voltage Vin plus the voltage drop across the base-to-emitter junction of the transistor 12, as illustrated by the following equation:

$$\text{Vout}=\text{Vin}+V_{BE12} \text{ When Vin}<-0.5 \text{ Volts} \quad (2)$$

When the input voltage is less than −0.5 volts, the transistor 12 will sink the load current IL, from the load resistor RL. In this situation, the load current IL is flowing in a direction opposite to the direction shown in FIG. 1. Because the level of the output voltage Vout is greater than the level of the input voltage Vin, the emitter-base junction of the transistor 10 is reverse-biased and will be cut off. As the input voltage Vin remains negative, the output voltage Vout will follow the input voltage Vin and remain at a level equal to the input voltage Vin plus the voltage drop across the base-to-emitter junction of the transistor 12.

The transistors 10 and 12 are biased at zero current and conduct only when the input voltage signal Vin is present. The driver circuit of FIG. 1 operates in a push-pull fashion: the transistor 10 pushes or sources current into the load resistor RL when the input voltage Vin is positive and the transistor 12 pulls or sinks current from the load resistor RL when the input voltage Vin is negative. The output voltage Vout follows the input voltage Vin as it goes positive or negative.

The driver circuit of FIG. 1 with high speed npn and pnp transistors will provide a high power and high bandwidth driver circuit for driving high performance monitors. However, such a driver circuit, requiring high speed npn and pnp transistors, requires a relatively expensive process to manufacture. As is well known among those skilled in the art, such high-speed pnp transistors are expensive to include within a system or integrated circuit. What is needed is a driver circuit having low power consumption and high frequency output with high current drive which does not require such high speed pnp transistors and can therefore be manufactured from an inexpensive process.

SUMMARY OF THE INVENTION

A driver circuit with pull down npn transistor drives an output voltage signal in response to an input voltage signal, without high-speed pnp transistors. A first npn transistor provides current to the output node when the output node is at a level equal to and less than the level of the input voltage signal less a base-to-emitter junction drop across the first npn transistor. A second npn transistor sinks current from the output node when the output node is at a level greater than the level of the input voltage signal less the base-to-emitter junction drop across the first npn transistor. The second npn transistor is controlled by a level of a control node. When the level of the output node is greater than the level of the input voltage signal less the base-to-emitter junction drop, the first npn transistor is turned off and the level of the control node is charged up by a current source. When the level of the control node reaches a sufficient level, the second npn transistor is turned on and the level of the output voltage signal is decreased.

DETAILED DESCRIPTION OF THE PREFERRED EMBODIMENT

A driver circuit with pull down npn transistor does not require the high speed pnp transistor described above in order to meet the performance characteristics for driving a high performance monitor. Only npn transistors are used to drive an output voltage signal in response to an input voltage signal. A first npn transistor provides current to the output node when the output node is at a level equal to and less than the level of the input voltage less a base-to-emitter junction drop across the first npn transistor. A second npn transistor under the control of a control node, sinks current from the output node and thereby lowers the level of the output voltage signal when the output node is at a level greater than the level of the input voltage signal less the base-to-emitter junction drop across the first transistor. In this manner, the output voltage signal is driven to follow the input voltage signal.

Figure 2:
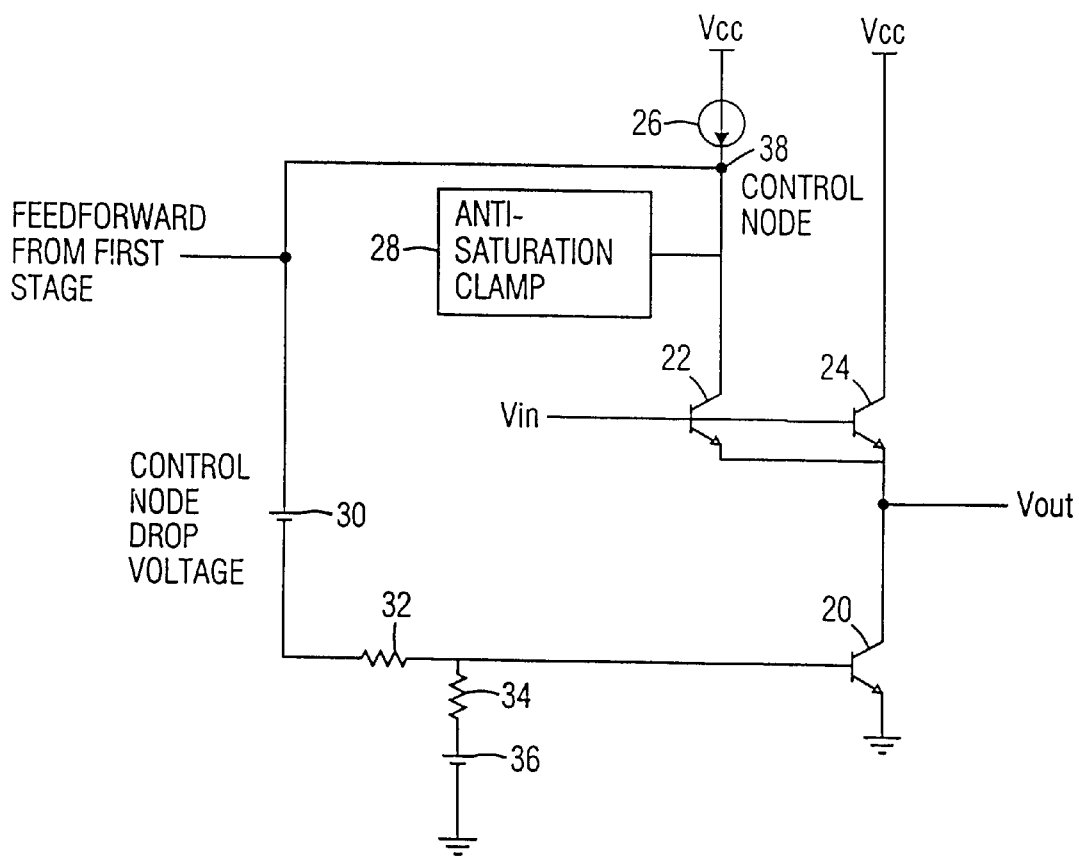
FIG. 2 illustrates a schematic diagram of a driver circuit according to the present invention.
Figure 3A:
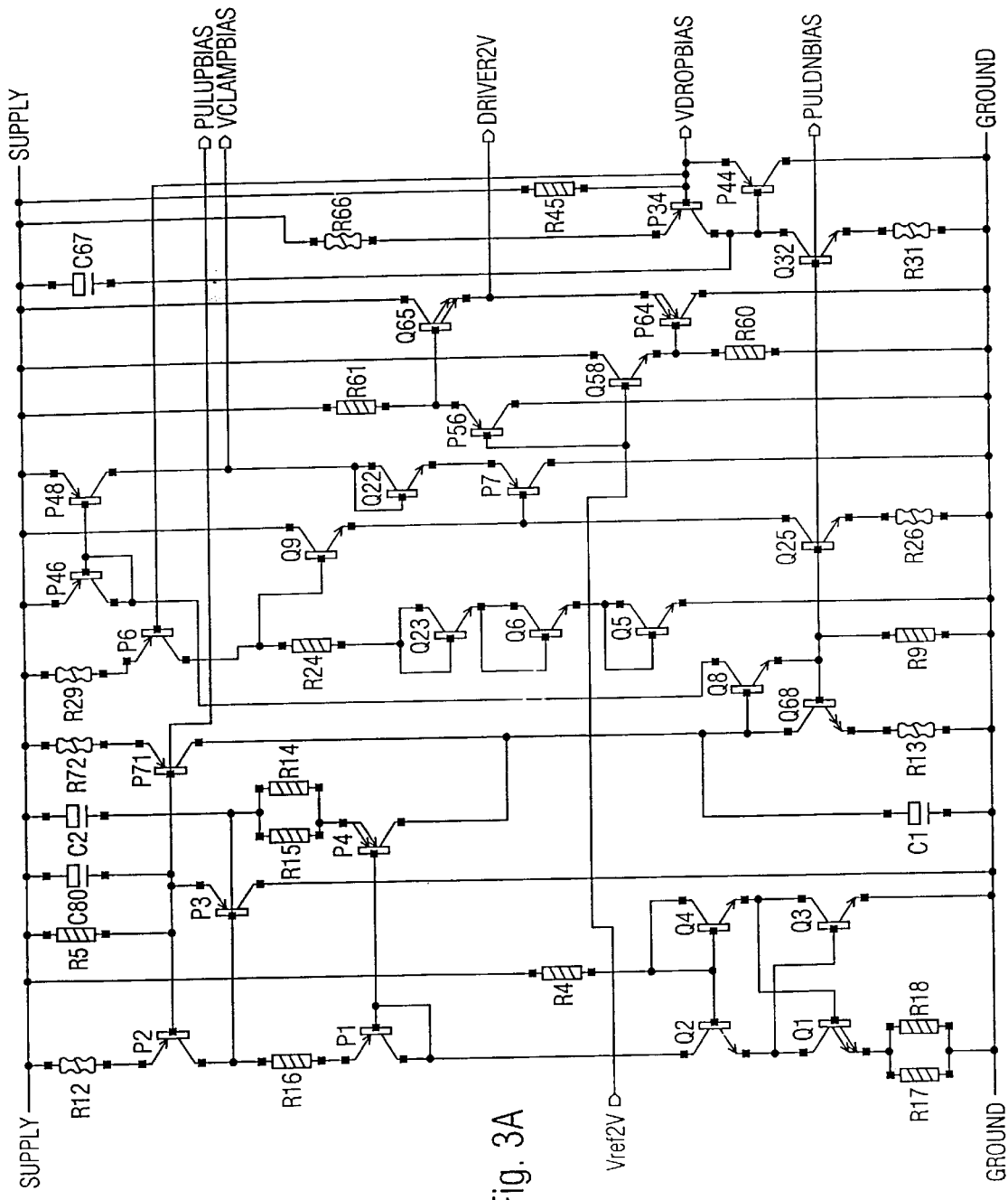
FIGS. 3A and 3B illustrate a detailed schematic diagram of a bias circuit and the driver circuit according to the present invention.

A schematic diagram of a driver circuit with pull-down npn transistor according to the present invention is illustrated in FIG. 2. The input voltage signal Vin is coupled to a base of an npn transistor 22 and to a base of an npn transistor 24. An emitter of the transistor 22 is coupled to an emitter of the transistor 24 and to a collector of an npn transistor 20, thereby forming an output node from which the output voltage signal Vout is provided. An emitter of the transistor 20 is coupled to ground. A collector of the transistor 24 is coupled to the supply voltage VCC. A collector of the transistor 22 is coupled to an anti-saturation clamp circuit 28, to a first terminal of a current source 26, to receive a feedforward biasing signal from a first stage biasing circuit and to a positive node of control biasing voltage source 30, thereby forming a control node 38. A second terminal of current source 26 is coupled to the supply voltage VCC. A negative terminal of the control biasing voltage source 30 is coupled to a first terminal of a resistor 32. A second terminal of the resistor 32 is coupled to a first terminal of a resistor 34 and to a base of the transistor 20. A second terminal of the resistor 34 is coupled to a positive node of a voltage source 36. A negative node of the voltage source 36 is coupled to ground. The biasing signals used within the driver circuit of FIG. 2 are generated by a first stage biasing circuit illustrated in the detailed schematic of FIG. 3A. The biasing signals include a Pull Up biasing signal pulupbias, a Voltage Clamp biasing signal vclampbias, a Voltage Drop biasing signal Vdropbias, a Driver signal Driver2V, and a Pull Down biasing signal puldnbias, as shown in FIG. 3A.

Figure 1:
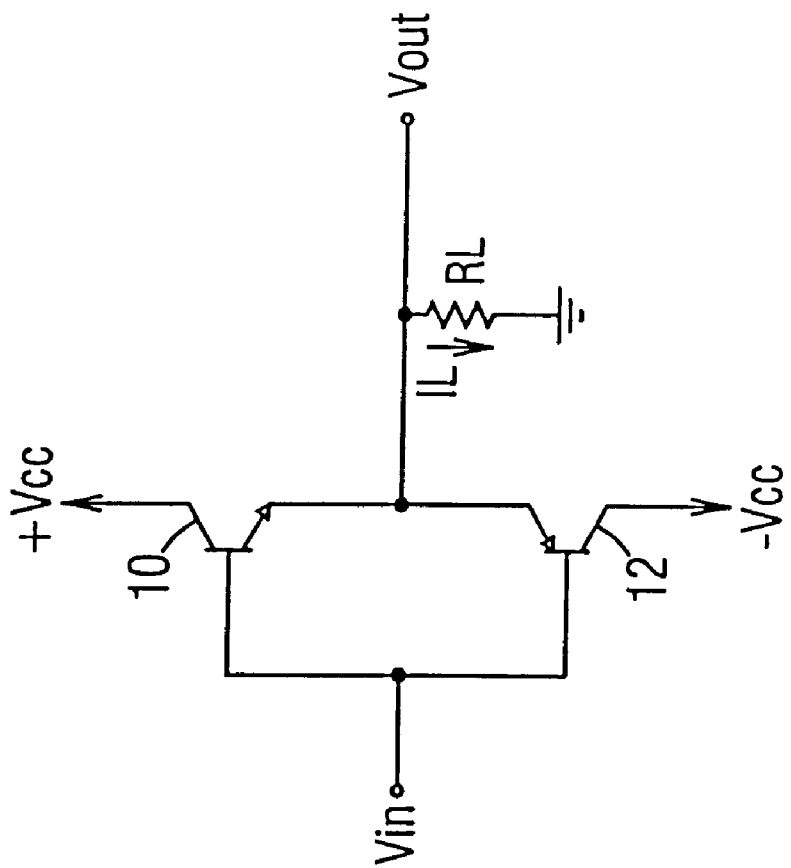
FIG. 1 illustrates a schematic diagram of a push-pull driver circuit of the prior art.

The driver circuit according to the present invention utilizes the npn transistor 20 to pull down the output voltage Vout, when necessary to track a declining input signal Vin, instead of the more expensive high-speed pnp pull-down transistor 12, used in the push-pull circuit of FIG. 1. This is accomplished by using the npn transistor 22, the control node 38 and the current source 26, to control the operation of the transistor 20. The transistor 20 is effectively a current switch, controlled by the control node 38, which is used to sink current from the output and pull the output voltage Vout down to a level equal to the input voltage Vin less a base-to-emitter junction drop of the transistor 22. When the output voltage Vout is lower than a base-to-emitter junction drop (approximately 0.8 volts) below the input voltage Vin, the transistor 22 acts as a common collector device and the output voltage Vout is pulled up to a level equal to a base-to-emitter junction drop below the level of the input voltage Vin. If the output voltage Vout is greater than a base-to-emitter junction drop above the input voltage Vin, then the transistor 22 acts more in a manner consistent with a common emitter device and the voltage created at the control node 38 is used to control the pull-down transistor 20. The transistor 24 mirrors the effects of the transistor 22 to provide a higher output current without requiring a high current through the control node 38.

In the quiescent bias state, the current source 26 regulates the biasing current through the output stage. The pair of transistors 22 and 24 allow the quiescent current to remain low and yet provide the ability to deliver high transient current in excess of the bias current. In the quiescent bias state, the level of the input voltage Vin is a base-to-emitter junction drop above the level of the output voltage Vout. Since all of the current from the current source 26 flows to the output, the voltage on the control node 38 will fall low and the transistor 20 is left in an off state.

When the input voltage Vin rises to a level greater than a base-to-emitter junction drop above the level of the output voltage Vout, the emitter follower transistors 22 and 24 will turn on and will therefore pull the level of the output voltage Vout up to a level equal to the input voltage Vin minus a base-to-emitter junction drop. Because the current is limited through the transistor 22 by the current source 26, the transistor 24, which is not limited by a current source, carries most of the current to the output. As the level of the output voltage Vout rises to a level equal to the level of the input voltage Vin less a base-to-emitter junction drop, the driver circuit will return to the equilibrium state.

When the input voltage Vin falls to a level less than a base-to-emitter junction drop above the level of the output voltage Vout, the emitter follower transistors 22 and 24 both turn off and cease to provide current to the output node. When the transistor 22 shuts off, the current source 26 adds charge directly to the control node 38, thus rapidly increasing the voltage level at the control node 38. As the voltage level at the control node 38 increases, the voltage level at the base of the transistor 20 also rises. When the voltage level at the base of the transistor 20 rises to a level equal to a base-to-emitter junction drop above ground, the transistor 20 will turn on and pull down the level of the output voltage Vout by sinking current. When the level of the output voltage Vout falls to a level equal to a base-to-emitter junction drop below the level of the input voltage Vin, the transistor 22 turns on again, which reduces the voltage level at the control node 38 and turns off the transistor 20, returning the driver circuit to the equilibrium state.

In this manner, the driver circuit of the present invention drives the output voltage Vout, according to the level of the input voltage Vin, without the use of expensive high-speed pnp transistors, while maintaining performance characteristics necessary to drive a high-performance monitor. The driver circuit of the present invention uses the npn transistors 20, 22 and 24 to drive the output voltage Vout in response to the input voltage Vin. Some pnp transistors are used within the bias circuit, illustrated in FIG. 3A. However, those pnp transistors are less expensive, low-speed transistors and are used to provide bias signals where speed is not as important.

The current source 26 is preferably proportional to ambient temperature for increasing the performance response characteristics over a range of temperatures. The current source 26 is generated by a separate cell and provides biasing currents to several output driver circuits within a system. The current source 26 is also used to generate a stable voltage level for the anti-saturation clamp circuit 28, which protects the transistor 22. The current source 26 is also used to generate an inversely proportional to ambient temperature voltage for the control node 38 drop voltage generated by the voltage supply circuit 30. This increases the dynamic range of the control node 38 by compensating for the decrease in the base-to-emitter junction drop of the transistor 20 at high temperatures. It should be readily understood, that the voltage supply 30 is a variable voltage supply and is used to increase the voltage level of the control node 38 when the transistor 22 is turned off, as described above. As the voltage level of the control node 38 increases, the voltage level at the base of the transistor 20 will increase proportionately.

The anti-saturation clamp circuit 28 helps to guarantee that the driver circuit balances at a stable operating point by providing extra current to the transistor 20 through the transistor 22, such that the quiescent current through the transistor 20 does not have to equal the quiescent current which is provided from the current source 26 and mirrored by the transistor 24. This compensates for a notable amount of device mismatch due to process, temperature and supply variations. Accordingly, such device mismatch will not affect the operation of the system other than to change the quiescent current. Because the driver circuit of the present invention has the ability to self-stabilize, some of the current from the control node 38 is used to operate an input differential amplifier within a first stage, through the feed forward path. This feed forward path also increases the response of the control node 38 to a change in the input voltage Vin. For example, as the input signal rises, the feed forward path pulls extra current from the control node 38, causing the voltage level of the control node 38 to decrease more rapidly and correspondingly, the transistor 20 will turn off faster, allowing the output voltage Vout to rise quicker.

The driver circuit according to the present invention uses the npn transistors 20, 22 and 24 to drive the output voltage signal Vout in response to the input voltage signal Vin. No high-speed pnp transistors are required in the driver circuit of the present invention. The npn transistor 20 is used to pull down the output voltage Vout, when the input voltage signal Vin is decreasing. When the output voltage Vout is greater than a base-to-emitter junction drop below the input voltage signal Vin, the transistors 22 and 24 are cutoff and the control node 38, and correspondingly the base of the transistor 20, are charged up from the current source 26. When the voltage level at the base of the transistor 20 rises above a base-to-emitter junction drop above ground, then the transistor 20 is turned on and pulls the level of the output voltage Vout down until it is at a level which is a base-to-emitter junction drop below the input voltage Vin. When the input voltage Vin is greater than a base-to-emitter junction drop above the level of the output voltage Vout, the transistors 22 and 24 are turned on and will pull the level of the output voltage Vout to a level equal to the input voltage Vin less a base-to-emitter junction drop.

Figure 3B:
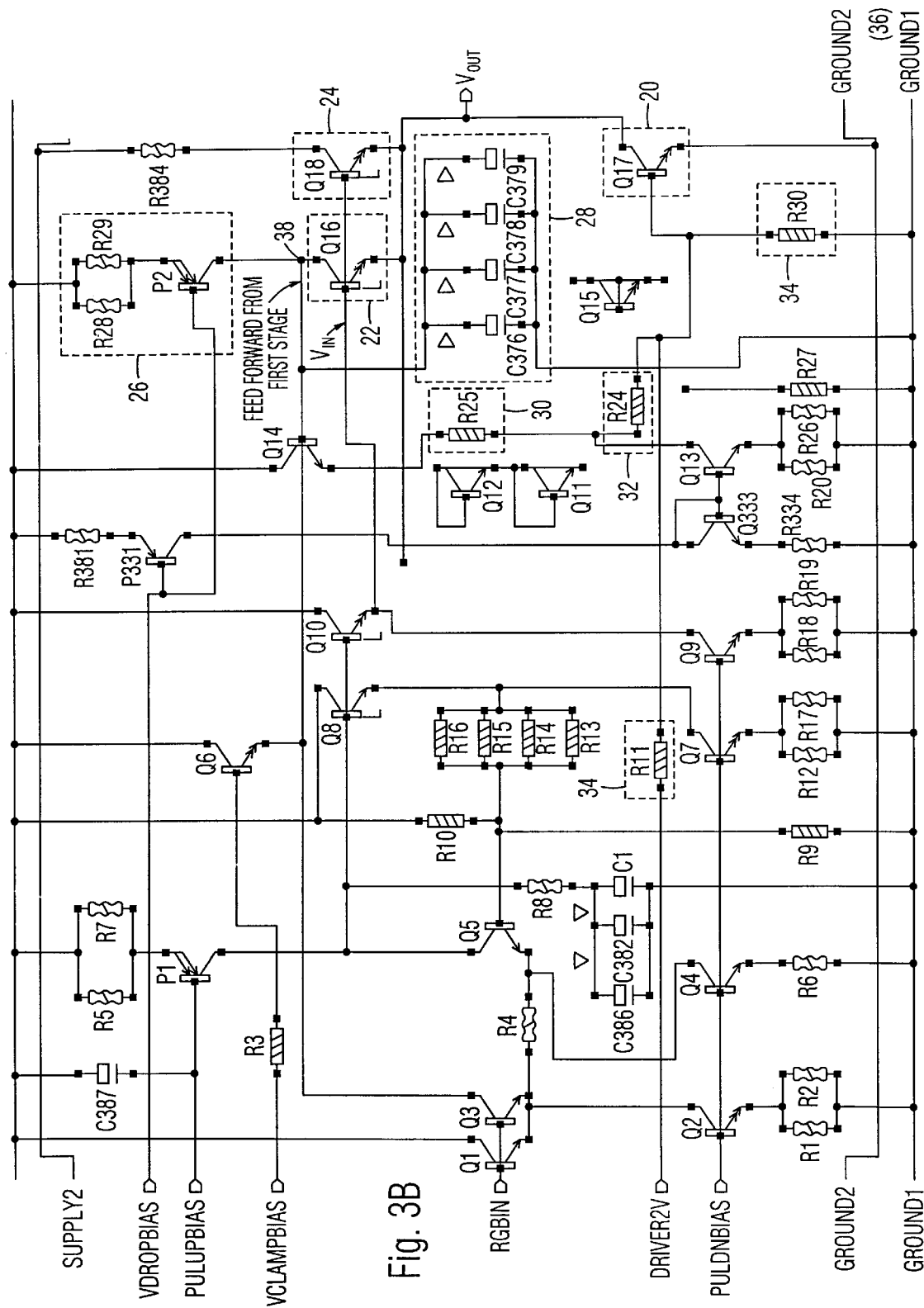
Figure 3B:
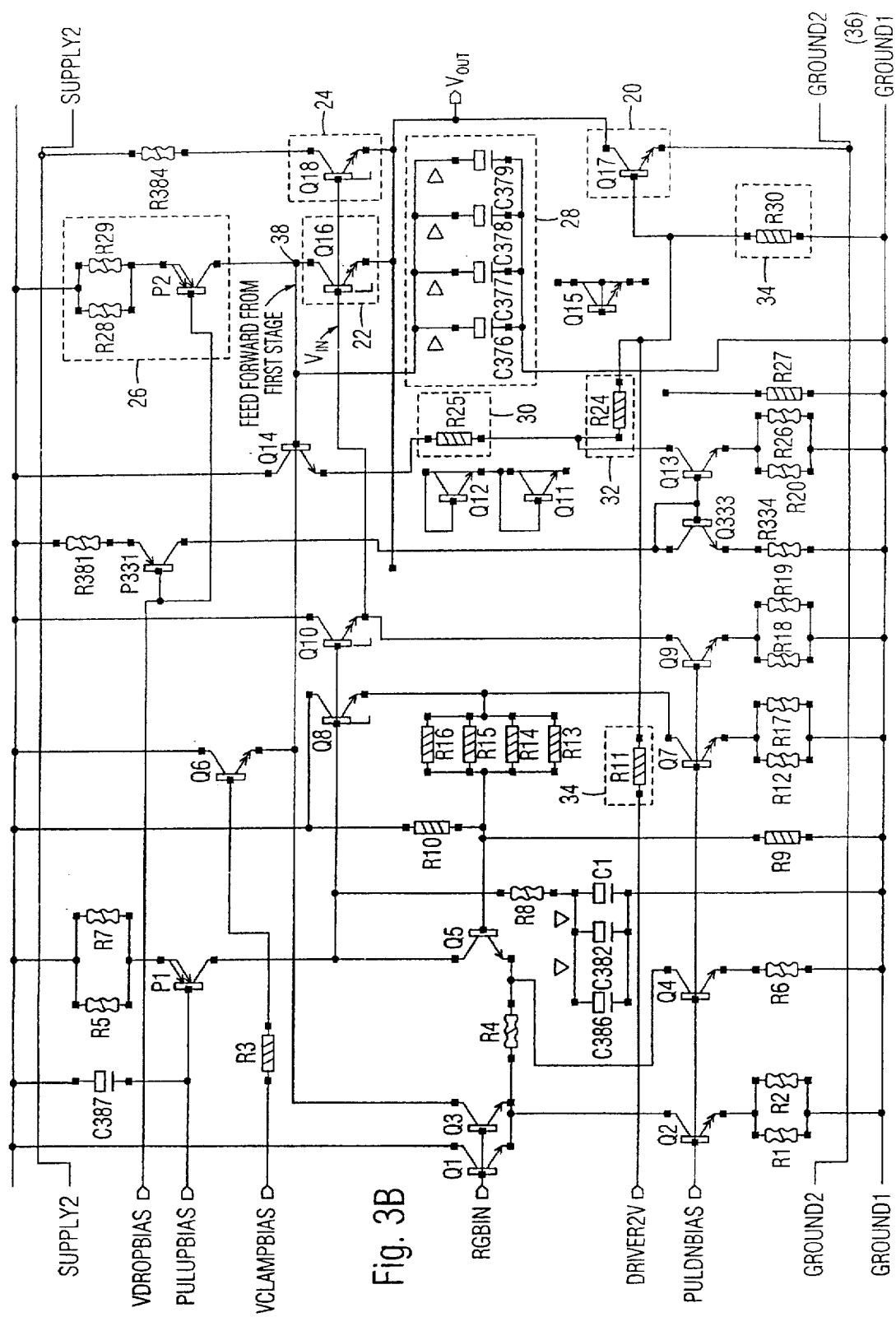

A detailed circuit schematic of the preferred embodiment of the driver circuit with npn pull down transistor is illustrated in FIG. 3B. A detailed circuit schematic of the biasing circuit providing biasing signals to the driver circuit is illustrated in FIG. 3A. The preferred embodiment of the driver circuit of the present invention is designed to be included within a monitor driving circuit. However, it should be apparent to those skilled in the art that the driver circuit of the present invention is also suitable for use within other types of driving circuit applications. The preferred embodiment of the present invention is implemented within an analog video encoder integrated circuit, Part No. CXA2075, which will be available from Sony Corporation of America, 3300 Zanker Road, San Jose, Calif. 95134.

While the preferred embodiment of the present invention has been illustrated and described as an integrated circuit using bipolar transistors, it will be apparent to a person of ordinary skill in the art that the circuit of the present invention may be implemented using another device technology, including but not limited to CMOS, MOS, discrete components and ECL.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

We claim:

1. A driver circuit for driving an output signal in response to an input signal comprising:
  a. a pull-up circuit including a first transistor and configured to receive the input signal having an input voltage level;
  b. a pull-down circuit including a second transistor of the same type as the first transistor;
  c. an output node having an output voltage level and coupled to both the pull-up and pull-down circuits for providing the output signal in response to the input signal;
  d. a control node having a control voltage level and coupled to both the pull-up and pull-down circuits for controlling the pull-down circuit according to a state of the pull-up circuit; and
  e. a voltage reducing circuit including a first resistor coupled to the pull-down circuit and a second resistor coupled between the pull-down circuit and the control node for reducing the control voltage level and providing a reduced control voltage to the pull down circuit.

2. The driver circuit as claimed in claim 1 further comprising a charging circuit coupled to the control node for increasing the control voltage level when necessary.

3. The driver circuit as claimed in claim 2 wherein the control voltage level is increased to a level sufficient to turn on the pull-down circuit when the pull-up circuit is turned off.

4. The driver circuit as claimed in claim 3 wherein the pull-up circuit is turned off when the output voltage level is greater than the input voltage level less a predetermined amount.

5. The driver circuit as claimed in claim 4 wherein the output voltage level is decreased when the pull-down circuit is turned on.

6. The driver circuit as claimed in claim 5 wherein the pull-up circuit is turned on when the output voltage level is less than the input voltage level less the predetermined amount.

7. The driver circuit as claimed in claim 6 wherein the output voltage level is increased when the pull-up circuit is turned on.

8. The driver circuit as claimed in claim 7 wherein the first and second transistors are both npn bipolar transistors.

9. The driver circuit as claimed in claim 8 wherein the predetermined amount is equal to a base-to-emitter junction drop.

10. The driver circuit as claimed in claim 1 wherein the voltage reducing circuit further comprises a voltage source coupled between the first resistor and a reference voltage level.

11. The driver circuit as claimed in claim 10 wherein the reference voltage level is electrical ground.

12. A video driver circuit for driving a video output signal in response to a video input signal comprising:
  a. an input node configured to receive the video input signal;
  b. an output node configured to provide the video output signal in response to the video input signal;
  c. a first transistor coupled between the input node and the output node for driving the video output signal in response to the video input signal;

d. a current switch coupled to the output node for drawing current from the output node and lowering a voltage level of the video output signal when the video input signal is decreasing;

e. a control node having a control voltage level coupled to the first transistor and to the current switch for controlling the current switch in response to a state of the first transistor;

f. a charging circuit coupled to the control node for increasing the control voltage level when necessary;

g. a first resistor coupled between the control node and the current switch;

h. a second resistor coupled between the current switch and electrical ground; and i. a voltage source coupled between the second resistor and electrical ground, wherein the first and second resistors and the voltage source are configured for reducing a gain of the driver circuit by dividing the control voltage level and providing a reduced control voltage to the current switch.

13. The video driver circuit as claimed in claim 12 wherein the control voltage level is increased to a level sufficient to turn on the current switch when the first transistor is turned off.

14. The video driver circuit as claimed in claim 13 wherein the first transistor is turned off when the video output signal is greater than the video input signal less a predetermined amount.

15. The video driver circuit as claimed in claim 14 wherein the current switch comprises a second transistor of the same type as the first transistor.

16. The video driver circuit as claimed in claim 15 wherein the first and second transistors are both npn bipolar transistors.

17. A driver circuit for driving an output signal in response to an input signal comprising:

a. a first transistor configured for receiving the input signal having an input voltage level;

b. an output node having an output voltage level coupled to the first transistor for providing the output signal in response to the input signal;

c. a second transistor of the same type as the first transistor coupled to the output node;

d. a control node having a control voltage level coupled to the first and second transistors for controlling the second transistor in response to a state of the first transistor;

e. a charging circuit coupled to the control node for increasing the control voltage level when necessary; and f. a voltage reducing circuit including a first resistor coupled to the second transistor and a second resistor coupled between the second transistor and the control node for reducing the control voltage level and providing a reduced control voltage to the second transistor.

18. The driver circuit as claimed in claim 17 wherein the voltage reducing circuit further comprises a voltage source coupled between the first resistor and a reference voltage level.

19. The driver circuit as claimed in claim 18 wherein the reference voltage level is electrical ground.

20. The driver circuit as claimed in claim 17 wherein the control voltage level is increased to a level sufficient to turn on the second transistor when the first transistor is turned off.

21. The driver circuit as claimed in claim 20 wherein the first transistor is turned off when the output voltage level is greater than the input voltage level less a predetermined amount.

22. The driver circuit as claimed in claim 21 wherein the first transistor is turned on when the output voltage level is less than the input voltage level less the predetermined amount.

23. The driver circuit as claimed in claim 22 wherein the first and second transistors are both npn bipolar transistors.

24. A driver circuit for driving an output signal in response to an input signal comprising:

a. a first npn transistor having a base, emitter and collector, wherein the base of the first npn transistor is configured to receive the input signal having an input voltage level;

b. a second npn transistor having a base, emitter and collector, wherein the emitter of the second npn transistor is coupled to ground;

c. an output node having an output voltage level coupled to the emitter of the first npn transistor and to the collector of the second npn transistor for providing the output signal in response to the input signal;

d. a control node coupled to the collector of the first npn transistor and to the base of the second npn transistor, wherein a control voltage at the control node is charged up to a level sufficient to turn on the second npn transistor when the first npn transistor is turned off;

e. a first resistor coupled between the control node and the base of the second npn transistor;

f. a second resistor coupled to the base of the second npn transistor; and g. a voltage source coupled between the second resistor and a reference voltage level wherein the first and second resistors and the voltage source are configured for reducing a gain of the driver circuit by dividing the control voltage and providing a reduced control voltage to the second npn transistor.

25. The driver circuit as claimed in claim 24 wherein the first npn transistor is turned off when the output voltage level is greater than the input voltage level less a predetermined amount.

26. The driver circuit as claimed in claim 25 wherein the second npn transistor sinks current from the output node when the second npn transistor is turned on.

27. The driver circuit as claimed in claim 26 wherin the first npn transistor is turned on when the output coltage level is less than the input voltage level less a predetermined anount.

28. The driver circuit as claimed in claim 27 wherein the first npn transistor sources current to the output node when the first npn transistor is turned on.

29. The driver circuit as claimed in claim 28 wherein the predetermined amount is equal to a base-to-emitter junction drop.

* * * * *

UNITED STATES PATENT AND TRADEMARK OFFICE
CERTIFICATE OF CORRECTION

PATENT NO. : 6,072,341

DATED : June 6, 2000

INVENTOR(S) : Nayebi et al.

It is certified that error appears in the above-identified patent and that said Letters Patent is hereby corrected as shown below:

IN THE DRAWINGS

In Figure 3B, sheet 4 of 4, the voltage source on the upper right hand side of the drawing is not labeled. The correct label is --SUPPLY2-- which matches the corresponding label of the same voltage source on the upper left hand side of the same drawing.

IN THE CLAIMS

In column 8, line 52, delete "as claimed in claim 26 wherin" and insert --as claimed in claim 24 wherein--.

In column 8, line 53, delete "output coltage level" and insert --output voltage level--.

In column 8, line 55, delete "anount" and insert --amount--.

Signed and Sealed this

Twenty-fourth Day of April, 2001

Attest:

NICHOLAS P. GODICI

Attesting Officer

Acting Director of the United States Patent and Trademark Office